United States Patent [19]

Kosmahl

[11] Patent Number: 4,780,684
[45] Date of Patent: Oct. 25, 1988

[54] MICROWAVE INTEGRATED DISTRIBUTED AMPLIFIER WITH FIELD EMISSION TRIODES

[75] Inventor: Henry G. Kosmahl, Olmsted Falls, Ohio

[73] Assignee: Hughes Aircraft Company, Los Angeles, Calif.

[21] Appl. No.: 111,467

[22] Filed: Oct. 22, 1987

[51] Int. Cl.$^4$ .............................................. H03F 3/60
[52] U.S. Cl. ..................................... 330/54; 313/309
[58] Field of Search ................... 330/54; 313/309, 336, 313/351

[56] References Cited

U.S. PATENT DOCUMENTS

| | | | |
|---|---|---|---|
| 2,778,886 | 1/1957 | Bradley | 330/54 |
| 3,453,478 | 7/1969 | Shoulders et al. | 313/309 |
| 3,665,241 | 5/1972 | Spindt et al. | 313/351 |
| 3,755,704 | 8/1973 | Spindt et al. | 313/309 |

OTHER PUBLICATIONS

E. L. Ginzton et al., "Distributed Amplification", Proceedings of the I.R.E., Aug. 1984, pp. 956–969.
Y. Ayasli et al., "A Monolithic GaAs 1–13-GHz Traveling-Wave Amplifier", IEEE Transactions on Microwave Theory and Techniques, vol. MTT-30, No. 7, Jul. 1982, pp. 976–981.
Y. Ayasli, "An Overview of Monolithic GaAs MES-FET Traveling-Wave Amplifiers", International Journal of Electronics, 1985, vol. 58, No. 4, pp. 531–541.
C. A. Spindt, "A Thin-Film Field-Emission Cathode", Journal of Applied Physics, vol. 39, No. 7, Jun. 1968, pp. 3504–3505.
C. A. Spindt et al., "Physical Properties of Thin-Film Field Emission Cathodes with Molybdenum Cones", Journal of Applied Physics, vol. 47, No. 12, Dec. 1976, pp. 5248–5263.
C. A. Spindt et al., "Recent Progress in Low-Voltage Field-Emission Cathode Development", Journal de Physique, vol. 45, No. C-9, Dec. 1984, pp. 269–278.

Primary Examiner—James B. Mullins
Attorney, Agent, or Firm—Paul M. Coble; Terje Gudmestad; A. W. Karambelas

[57] ABSTRACT

The disclosed microwave distributed amplifier includes a plurality of cascaded field emission triodes, each having a field emission element for emitting electrons, a grid disposed downstream from the field emission element along the electron flow path and an anode disposed further downstream along the electron flow path. A series of inductive strips interconnect successive grids to form a grid transmission line, while another series of inductive strips interconnect successive anodes to form an anode transmission line. Small electron transit times over integrated circuit distances in a vacuum environment and low interelectrode capacitance allow extremely large gain-bandwidth products to be achieved.

49 Claims, 5 Drawing Sheets

MICROWAVE INTEGRATED DISTRIBUTED AMPLIFIER WITH FIELD EMISSION TRIODES

TECHNICAL FIELD

This invention relates generally to microwave amplifiers, and more particularly relates to an integrated distributed amplifier constructed with field emission triodes.

BACKGROUND OF THE INVENTION

In order to provide extremely wideband amplification, distributed amplifiers were developed which utilize traveling-wave concepts in the grid and plate circuits of a series of thermionic electron tubes. An input signal is applied to an appropriately terminated grid transmission line which consists of the grid-to-cathode capacitance of the tubes as shunting elements and the inductance between the tube grids as series elements. The output signal is obtained from an appropriately terminated plate transmission line consisting of the plate-to-cathode capacitance as shunting elements and the inductance between the tube plates as series elements. The input signal causes a wave to travel along the grid transmission line which, when it arrives at the respective grids of the electron tubes, produces current flow in the plate circuits of the tubes, resulting in waves that travel in both directions in the plate transmission line. For a perfect termination at the end of the plate line away from the output, the waves traveling toward such termination, which are out of phase, will be completely absorbed and will not contribute to the output signal. On the other hand, the waves traveling toward the output end of the plate line will add in phase, producing an output signal proportional to the number of tubes. Further details concerning early forms of distributed amplifiers may be found in the classic paper by E. L. Ginzton et al "Distributed Amplification", *Proceedings of the I.R.E.*, August 1948, pages 956–969.

In recent years distributed amplifiers have been implemented at microwave frequencies using gallium arsenide field effect transistors as the active elements and microstrip transmission lines as the input and output lines. Microwave amplifiers of this type are described in detail in the papers by Y. Ayasli et al, "A Monolithic GaAs 1-13-GHz Traveling-Wave Amplifier", *IEEE Transactions on Microwave Theory and Techniques*, Vol. MTT-30, No. 7, July 1982, pages 976–981, and Y. Ayasli, "An Overview of Monolithic GaAs MESFET Traveling-Wave Amplifiers", *International Journal of Electronics*, 1985, Vol. 58, No. 4, pages 531–541.

Although distributed amplifiers fabricated with field effect transistors are smaller in size, consume less power and have less tendency for mechanical failure than distributed amplifiers constructed with thermionic electron tubes, nevertheless, both of the aforediscussed types of distributed amplifiers are limited in their operating frequencies by excessively large electrode capacitances and excessively long charge carrier transit times. In addition, the relatively low efficiency of field effect transistor distributed amplifiers gives rise to heat removal problems.

A further device of relevance to the present invention is the thin-film field emission cathode. This device comprises a metal/insulator/metal film sandwich with a cellular array of holes through the upper metal and insulator layers, leaving the edges of the upper metal layer (which serves as an accelerator electrode) effectively exposed to the upper surface of the lower metal layer (which serves as an emitter electrode). A number of conically-shaped electron emitter elements are mounted on the lower metal layer and extend upwardly therefrom such that their respective tips are located in respective holes in the upper metal layer. When appropriate voltages are applied between the emitter electrode, accelerator electrode, and an anode located above the accelerator electrode, electrons are caused to flow from the respective cone tips to the anode. Further details regarding thin-film field-emission cathodes may be found in the papers by C. A. Spindt, "A Thin-Film Field-Emission Cathode", *Journal of Applied Physics*, Vol. 39, No. 7, June 1968, pages 3504–3505, C. A. Spindt et al, "Physical Properties of Thin-Film Field Emission Cathodes with Molybdenum Cones", *Journal of Applied Physics*, Vol. 47, No. 12, December 1976, pages 5248–5263, and C. A. Spindt et al "Recent Progress in Low-Voltage Field-Emission Cathode Development", *Journal de Physique*, Vol. 45, No. C-9, December 1984, pages 269–278, and in U.S. Pat. No. 3,453,478 to K. R. Shoulders et al and U.S. Pat. Nos. 3,665,241 and 3,755,704 to C. A. Spindt et al.

SUMMARY OF THE INVENTION

It is an object of the present invention to provide a microwave distributed amplifier capable of operating at higher frequencies than heretofore has been achieved.

It is a further object of the invention to provide a high-gain, wideband distributed amplifier using field emission triodes which has a gain-bandwidth product two-to-three orders of magnitude greater than distributed amplifiers constructed with field effect transistors.

It is another object of the invention to provide a microwave distributed amplifier having a large bandwidth with a large gain at frequencies as high as 100 GHz or more.

It is yet another object of the invention to provide a high-gain, wideband microwave distributd amplifier capable of being fabricated as an integrated circuit with dimensions on the order of microns.

It is a still further object of the invention to provide a microwave distributed amplifier which is operable with relatively low voltages.

It is still another object of the invention to provide a high-gain, wideband microwave integrated distributed amplifier having superior heat handling capablilities.

A microwave distributed amplifier according to the invention includes a plurality of cascaded field emission triodes, each having a field emission element for emitting electrons, a grid disposed downstream from the field emission element along the flow path for electrons therefrom, and an anode disposed downstream from the grid along the electron flow path. A plurality of first electrically conductive strips interconnect successive grids of respective ones of the field emission triodes and form in conjunction with the grids a first microwave transmission line. A plurality of second electrically conductive strips interconnect successive anodes of respective ones of the field emission triodes and form in conjunction with the anodes a second microwave transmission line. An input microwave signal is applied to the first transmission line near the grid of the first field emission triode, while an output microwave signal is obtained from the second transmission line near the anode of the last field emission triode. Suitable operating potentials are applied to the field emission elements, the grids, and the anodes.

Additional objects, advantages, and characteristic features of the present invention will become readily apparent from the following detailed description of preferred embodiments of the invention when considered in conjunction with the accompanying drawings.

DETAILED DESCRIPTION OF THE INVENTION

Figure 1:
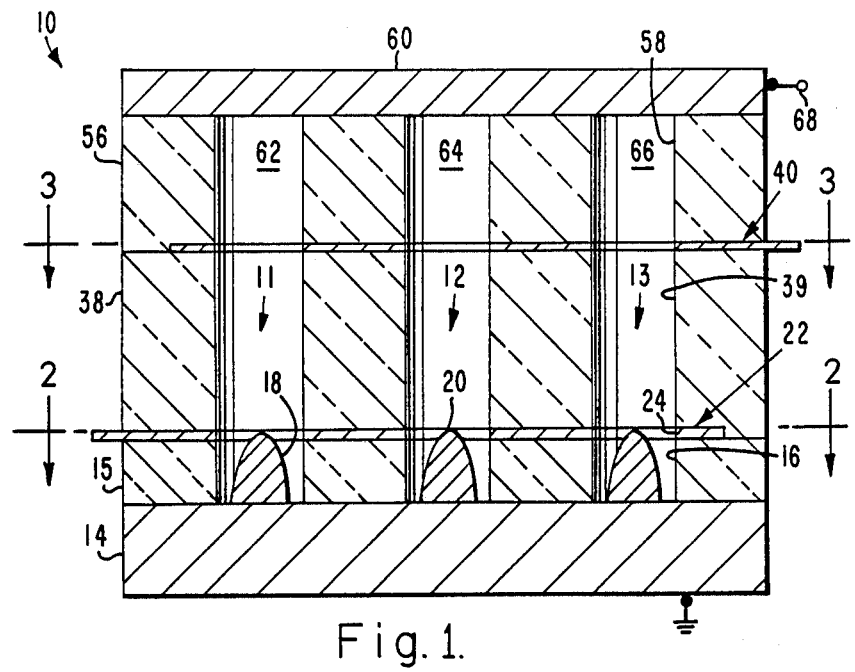
FIG. 1 is a longitudinal sectional view illustrating a microwave integrated distributed amplifier according to one embodiment of the invention.
Figure 2:
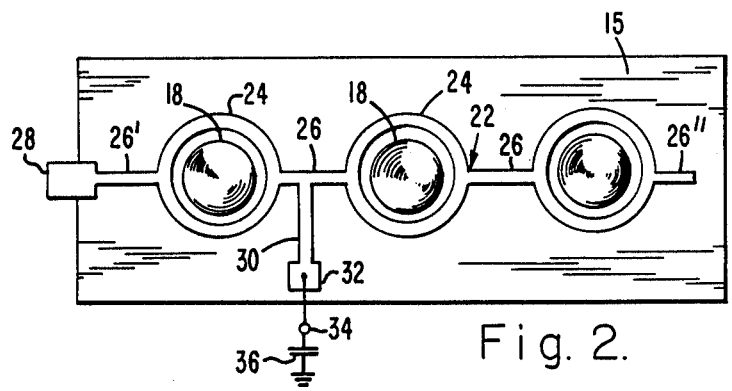
FIG. 2 is a plan sectional view taken along line 2—2 of FIG. 1.
Figure 3:
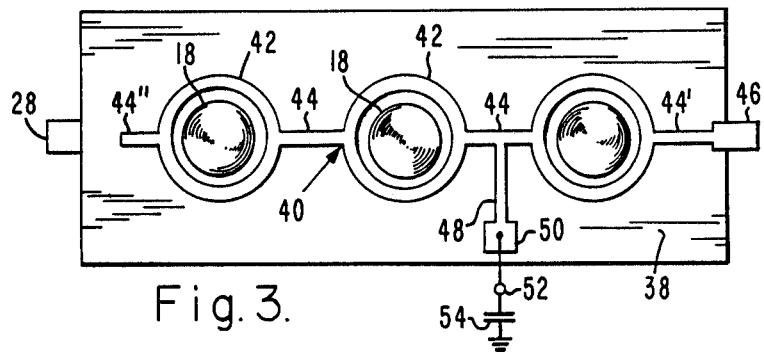
FIG. 3 is a plan sectional view taken along line 3—3 of FIG. 1.

Referring to FIGS. 1-3 with greater particularity, a microwave integrated distributed amplifier 10 is illustrated as comprising a plurality of cascaded thin-film field emission triodes 11, 12, and 13. Although only three triodes are shown for purposes of illustration, it should be understood that in practice a distributed amplifier according to the invention would include a considerably larger number of triodes, such as ten to twenty or more.

The distributed amplifier 10 is constructed on a substrate 14 of electrically conductive material such as molybdenum, copper, or gold. An electrically insulating spacer layer 15 is formed on the substrate 14 and is provided with a plurality (equal to the number of triodes) of holes 16 spaced along the length of the layer 15. The insulating layer 15 may be of silicon dioxide and may have a thickness of about 1.5 microns.

A plurality of field emission elements 18 are mounted on the substrate 14 at centrally disposed locations in the respective holes 16. The field emission elements 18 may be of a metal such as molybdenum and may be shaped substantially in the form of semiellipsoids of revolution with their respective bases attached to the substrate 14 and with sharply curved end regions 20 extending slightly above the top of the insulating layer 15. As a specific example for illustrative purposes, the end regions 20 may have a radius of curvature ranging from about 200 Å to about 400 Å. The end regions 20, which function as electron emission areas from the elements 18, may be provided with a thin coating of hafnium carbide or other low work function carbide such as yttrium carbide or niobium carbide (50 Å to 100 Å thick, for example) in order to reduce the work function of the elements 18 and thereby enhance the emission per element. This enables the distributed amplifier 10 to operate with higher emission currents and lower control voltages.

A first electrically conductive film 22, patterned in a configuration of alternating rings and strips to form a microwave transmission line as described in more detail below, is formed on the upper surface of the insulating layer 15, for example by vacuum deposition and selective etching. The film 22 may be of a metal such as molybdenum and may have a thickness of about 0.4 microns, for example. As shown in FIG. 2, the film 22 is configured in a pattern of alternating rings 24 coaxially disposed about respective field emission elements 18 and elongated inductive strips 26 which interconnect neighboring rings 24. The rings 24 serve as respective grids for the triodes 11, 12, and 13, while the arrangement of rings 24 and strips 26 form a grid transmission line. As a specific example for illustrative purposes, the rings 24 may have an inner diameter of about 1 micron and the strips 26 a length (i.e., distance between adjacent rings 24) of about 15 microns, the width of the rings 24 and strips 26 both being about 0.5 micron.

An input strip 26' extends from the ring 24 nearest to the input end of the amplifier 10 in direction away from the other rings 24 and terminates in a pad 28 which projects beyond the edge of the insulating layer 15. The pad 28 may be located in a waveguide (not shown) which feeds input microwave signals to the amplifier 10. An end strip 26" extends from the ring 24 nearest to the opposite end of the amplifier 10 in a direction away from the other rings 24. The length of the input strip 26' and the end strip 26" should be selected so that the grid transmission line is terminated in a desired characteristic impedance, which typically may be about 200 to 300 ohms.

In order to enable an appropriate control voltage to be applied to the grid film 22, a transverse strip 30 may extend from one of the strips 26 to a pad 32 which, in turn, is connected to a power supply terminal 34. The transverse strip 30 provides a dc short circuit and may have a length equal to one quarter wavelength for microwave signals being amplified. A capacitor 36 may be connected between the power supply terminal 34 and ground to provide an rf short circuit and thereby prevent the power supply from introducing an rf transmission line mismatch.

Disposed over the grid transmission line film 22 and the insulating layer 15 is a second insulating spacer layer 38. The insulating layer 38 may be of silicon dioxide and may have a thickness ranging from about 5 microns to about 20 microns, for example. The insulating spacer layer 38 is provided with a plurality of cylindrical holes 39 aligned with respective holes 16 in the insulating layer 15.

A second electrically conductive film 40, which may be of a metal such as molybdenum, is formed on the insulating layer 38. As shown in FIG. 3, the film 40 is configured in a pattern of alternating rings 42 and elongated inductive strips 44 which interconnect neighboring rings 42. The rings 42 and strips 44 may be dimensioned similarly to and aligned with respective rings 24 and strips 26 in the grid film 22. The rings 42 serve as respective anodes for the triodes 11, 12, and 13, while the arrangement of rings 42 and strips 44 forms an anode transmission line.

The anode film 40 also includes an output strip 44' which extends from the ring 42 nearest to the output end of the amplifier 10 in a direction away from the other rings 42 and terminates in a pad 46 which projects beyond the edge of the insulating layer 38. The pad 46 may be located in an output waveguide (not shown) to which output microwave signals from the amplifier 10 are applied. An end strip 44″ extends from the ring 42 nearest to the input end of the amplifier 10 in a direction away from the other rings 42. The length of the strips 26″ and 44″ is selected so that the anode transmission line is terminated in a desired characteristic impedance, preferably the same as that of the grid transmission line. In order to apply an appropriate voltage to the anode film 40 a quarter wavelength strip 48 may extend transversely from one of the strips 44 to a pad 50 which, in turn, is connected to a power supply terminal 52, with an rf shorting capacitor 54 connected between the terminal 52 and ground.

Disposed over the anode transmission line film 40 is a third insulating spacer layer 56. The layer 56 may be of silicon dioxide and may have a thickness ranging from about 5 microns to about 10 microns, for example. The insulating layer 56 is provided with a plurality of cylindrical holes 58 aligned with respective holes 39 and 16 in the insulating layers 38 and 15, respectively, and the inner circumference of respective anode rings 42 and grid rings 24.

A relatively thick electrically conductive plate 60 is disposed on the insulating layer 56 to serve as a common collector for electrons emitted from the field emission elements 18 and traveling along passageways 62, 64, and 66 defined by the respective series of aligned holes 16, 39, and 58. The plate 60 should be of a material having good thermal conductivity such as copper to facilitate heat removal from the amplifier 10. The collector plate 60 is connected to a power supply terminal 68 providing an appropriate collector voltage. As a specific example for illustrative purposes, considering the substrate 14 at ground (0 volts), the voltage furnished to grid power supply terminal 34 may be around 100 volts, the voltage furnished to anode power supply terminal 52 may be around 200 volts, and the voltage furnished to collector power supply terminal 68 may be around 210 volts. The collector plate 60 resides at ground potential for rf signals and serves as a grounded return for the anode transmission line. The substrate 14, spacer layers 15, 38 and 56, grid transmission line film 22, anode transmission line film 40, and collector plate 60 form a hermetically sealed device, and the electron passageways 62, 64, and 66 are evacuated to a predetermined vacuum pressure such as $10^{-9}$ Torr or less.

Figure 4:
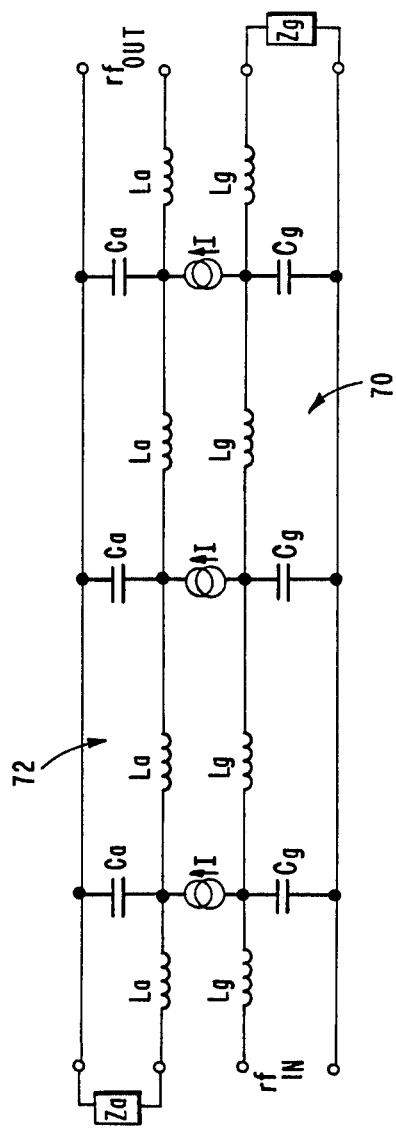
FIG. 4 is a schematic equivalent circuit diagram for the distributed amplifier of FIGS. 1-3.

An equivalent circuit representing the electrical behavior of the distributed amplifier of FIGS. 1-3 is given in FIG. 4. The circuit may be seen to include a grid transmission line 70 comprising a plurality of series inductances $L_g$ and shunt capacitances $C_g$ and an anode transmission line 72 comprising a plurality of series inductances $L_a$ and shunt capacitances $C_a$. The inductance values are determined primarily by the strips 26, 26′, 26″, 44, 44′, and 44″, and the capacitance values primarily by the rings 24 and 42, although it should be understood that, as with any integrated circuit, some inductive and capacitive contributions are provided by other circuit components.

In each of the triodes 11, 12, and 13 electron current is caused to flow from the field emission element 18 past grid ring 24 and anode ring 42. The voltage between the anode ring 42 and the grid ring 24 establishes a convergent lens that focuses the electrons into a central region within the anode ring 42. As the electrons travel past the anode ring 42, current is induced in the ring 42, which for small transit times is substantially equal to the electron current. Thus, in FIG. 4 each of the triodes 11, 12, and 13 are represented as having a current source providing a current I between the grid transmission line 70 and the anode transmission line 72.

Input microwave signals rf$_{in}$ are applied to the input end of the grid transmission line 70, while the opposite end of the transmission line 70 is terminated in a characteristic impedance $Z_g$ given by $Z_g = \sqrt{L_g/C_g}$. Similarly, amplified output microwave signals rf$_{out}$ are obtained from output end of the anode transmission line 72, the opposite end of the transmission line 72 being terminated in a characteristic impedance $Z^a$ given by $Z_a = \sqrt{L_a/C_a}$. In designing the distributed amplifier 10 the transmission lines 70 and 72 preferably should be constructed such that $Z_g = Z_a$. This may be achieved by first selecting an appropriate spacing between the grid transmission line film 22 and the anode transmission line film 40 based on electron transit time considerations and then selecting an appropriate spacing between the anode transmission line film 40 and the collector plate 60 such that the anode transmission line characteristic impedance $Z_a$ is equal to the grid transmission line characteristic impedance $Z_g$.

Since the transit time for electrons to travel from the field emission elements 18 to the regions of the respective anode rings 42 is exceptionally small, the microwave distributed amplifier 10 is capable of operating at higher frequencies than heretofore has been achieved. Moreover, since the total capacitance between the grid rings 24 and ground may be as small as around $10^{-16}$ farads, transconductance/capacitance ratios $g_m/C$ two-to-three orders of magnitude greater than that for distributed amplifiers constructed with field effect transistors may be obtained, thereby achieving comparably larger gain-bandwidth products.

Figure 5:
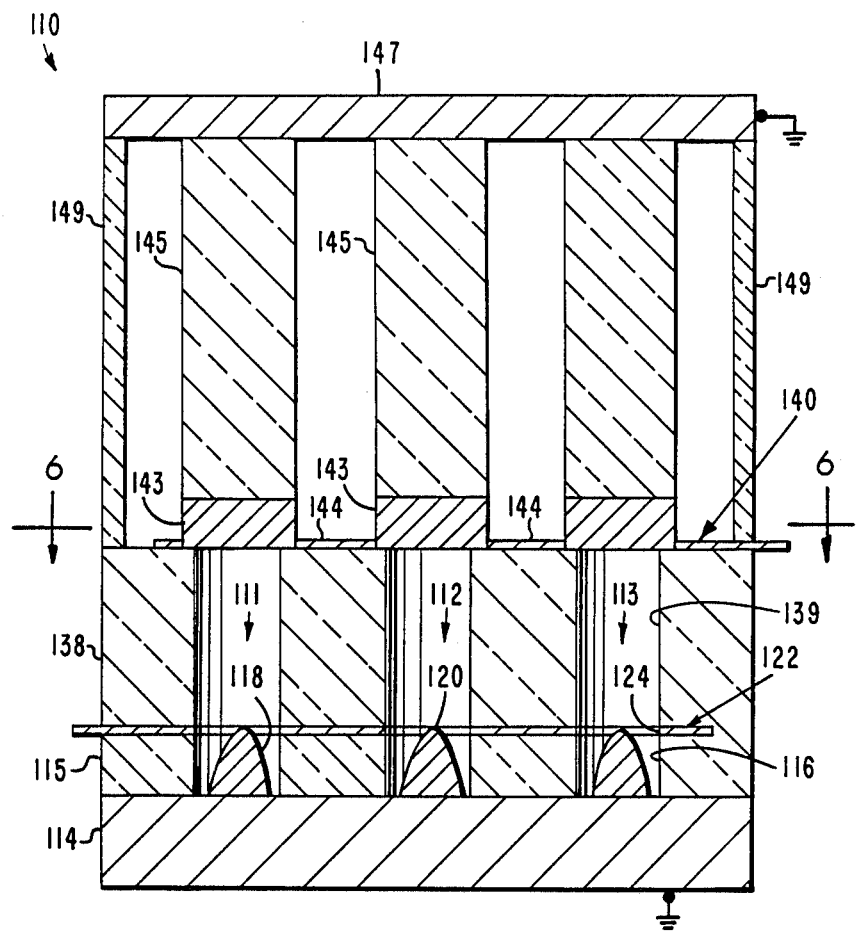
FIG. 5 is a longitudinal sectional view showing a microwave integrated distributed amplifier according to another embodiment of the invention.
Figure 6:
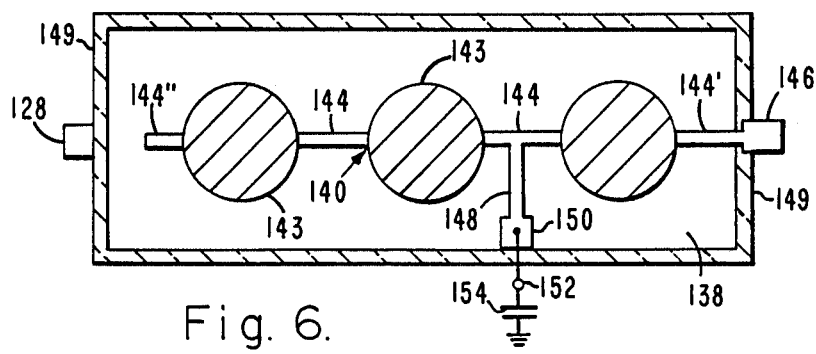
FIG. 6 is a plan sectional view taken along line 6—6 of FIG. 5.

A microwave integrated distributed amplifier according to another embodiment of the invention is illustrated in FIGS. 5-6. Components in the embodiment of FIGS. 5-6 which are the same as or equivalent to respective components in the embodiment of FIGS. 1-3 are designated by the same second and third reference numeral digits as their corresponding components in FIGS. 1-3, along with the addition of a prefix numeral "1".

In the amplifier 110 of FIGS. 5-6 anode transmission line 140 comprises a series of alternating electrically conductive cylindrical slabs 143 disposed downstream from and coaxially aligned with respective grid rings 124 and elongated inductive strips 144 which interconnect neighboring slabs 143. The slabs 143 extend completely across the respective electron passageways 139 and not only serve as anodes for the respective triodes 111, 112 and 113 but also as collectors for electrons traveling along the passageways 139. The thickness, or axial extent, of the slabs 143 is substantially greater than the thickness of the strips 144 and may be 100 microns or more, for example.

In order to facilitate heat removal from the slabs 143, dielectric rods 145 of a material of high thermal conductivity such as diamond 2A or beryllia may be disposed in contact with respective end surfaces of the slabs 143 remote from the electron passageways 139 and may extend coaxially from the slabs 143 to a relatively thick housing top plate 147. The plate 147, which should be of a material having good thermal conductivity such as copper, is maintained at ground potential. The housing for the amplifier 110 is completed by electrically insulating side wall members 149 which extend from the insulating layer 138 to the plate 147. In order to minimize the capacitance $C_a$ between the anode slabs 143 and ground, the separation between the slabs 143 and the grounded plate 147 is made large, for example, between about 1000 and 2000 microns. The slabs 143 and the interconnecting strips 144 are dimensioned to provide an inductance-capacitance ratio $L_a/C_a$ to achieve the desired characteristic impedance $Z_a$ for the anode transmission line 140.

In view of the greater current handling capabilities of the triodes 111, 112 and 113, the amplifier 110 of FIGS. 5-6 is able to achieve a higher transconductance $g_m$ and greater amplification than the amplifier 10 of FIGS. 1-3. Moreover, the large anode-to-ground spacing enables a very small anode capacitance $C_a$ to be obtained, thereby achieving larger gain-bandwidth products.

Figure 7:
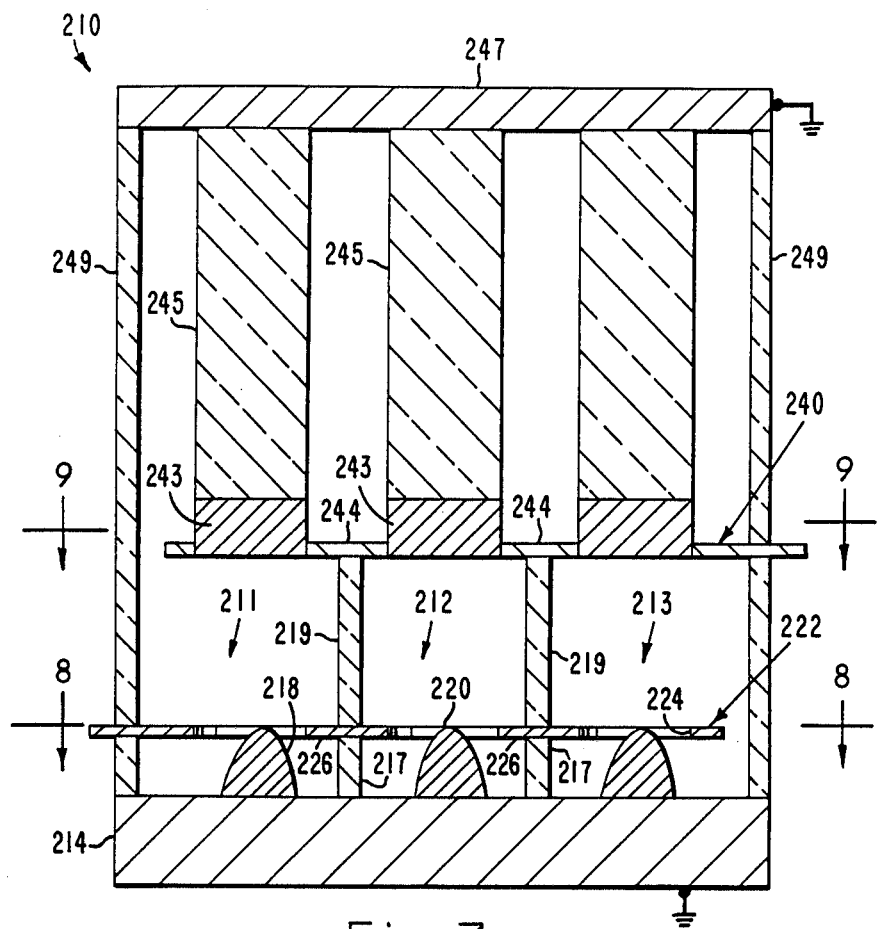
FIG. 7 is a longitudinal sectional view illustrating a microwave distributed amplifier according to a further embodiment of the invention.
Figure 9:
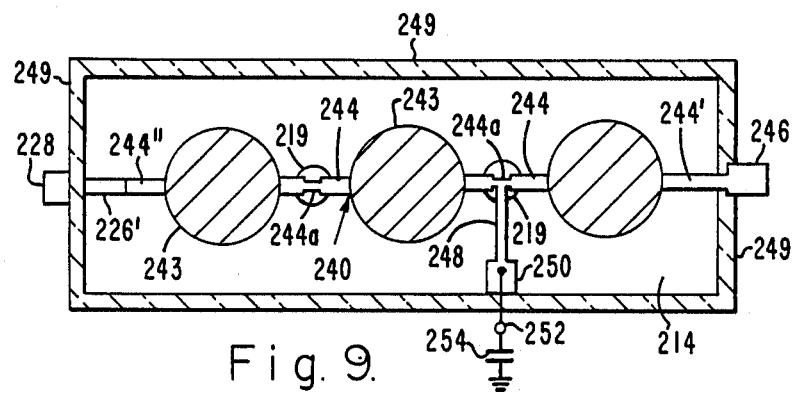
FIG. 9 is a plan sectional view taken along line 9—9 of FIG. 7.
Figure 8:
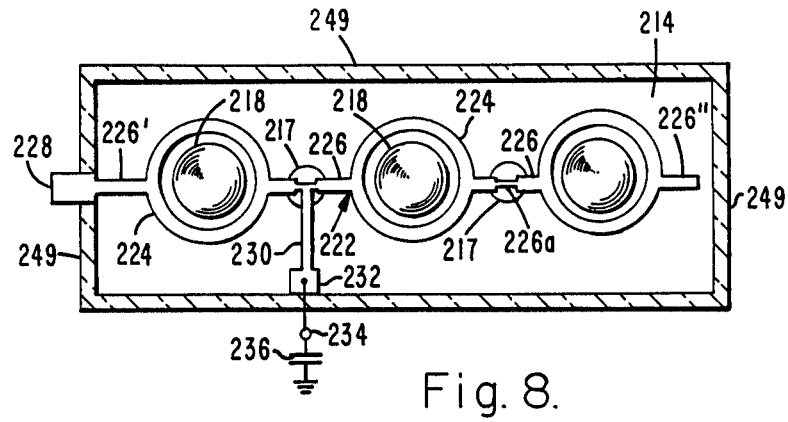
FIG. 8 is a plan sectional view taken along line 8—8 of FIG. 7.

The anode and grid capacitances $C_a$ and $C_g$, respectively, may be reduced further by reducing the dielectric loading of the transmission lines 40 and 22 (or 140 and 122). A further embodiment of the invention in which this is achieved is illustrated in FIGS. 7-9. Components in the embodiment of FIGS. 7-9 which are the same as or equivalent to respective components in the embodiments of FIGS. 1-3 or 5-6 are designated by the same second and third reference numeral digits as their corresponding components in FIGS. 1-3 or 5-6, along with the addition of a prefix numeral "2".

In the microwave amplifier 210 of FIGS. 7-9 each of the insulating spacer layers (15 and 38 or 115 and 138 of the respective embodiments of FIGS. 1-3 and 5-6) is replaced by a plurality of electrically insulating posts. Specifially, a series of first electrically insulating posts 217 are disposed between substrate 214 and respective grid transmission line strips 226, while a series of second electrically insulating posts 219 are disposed between respective grid transmission line strips 226 and anode transmission line strips 244. Preferably, respective ones of the first posts 217 are aligned with respective ones of the second posts 219 approximately midway between neighboring triodes 211 and 212, or 212 and 213. The posts 217 and 219 may be of a dielectric material such as silicon dioxide and may be formed by additional selective etching of layers such as 115 and 138. As a specific example for illustrative purposes, the posts 217 and 219 may have a diameter of about ¼ micron.

Since the posts 217 and 219 present a dielectric constant greater than that of the surrounding space, in order to maintain the desired inductance/capacitance ratio for both the grid transmission line 222 and the anode transmission line 240, the respective portions 226a and 244a of the inductive strips 226 and 244 adjacent to the posts 217 and 219 should have a width smaller than that of the remainder of the strips 226 and 244, thereby increasing the strip inductance in the region adjacent to the posts 217 and 219. The posts 217 and 219, in conjunction with the electrically insulating side wall members 249 which extend from the housing top plate 247 to the substrate 214, provide support for the grid and anode transmission lines 222 and 240, respectively.

Since in the embodiment of FIGS. 7-9 the amount of dielectric material in the vicinity of the transmission lines is minimized, extremely small anode and grid capacitances $C_a$ and $C_g$, respectively, may be realized, thereby achieving exceptionally large gain-bandwidth products. In fact, a distributed amplifier according to the invention can achieve at least an octave bandwidth with a large gain at microwave frequencies as high as several hundred GHz. In addition, an amplifier according to the invention is capable of being fabricated as an integrated circuit with dimensions on the order of microns, is operable with relatively low voltages, and has superior heat handling capabilities.

Although the invention has been shown and described with reference to particular embodiment, various changes and modifications may occur to a person skilled in the art to which the invention pertains. For example, the substrates 14, 114, and 214 and the transmission lines 22, 40, 122, 140, 222, and 240 may be made of superconductive material and the amplifiers 10, 110, and 210 immersed in an appropriate coolant such as liquid nitrogen capable of maintaining the substrates 14, 114, and 214 and the transmission lines 22, 40, 122, 140, 222, and 240 in a superconductive state. Modifications which are obvious to one skilled in the art are deemed to lie within the spirit, scope, and contemplation of the invention.

What is claimed is:

1. A microwave distributed amplifier comprising:
   a plurality of cascaded field emission triodes, each having a field emission element for emitting electrons, a grid disposed downstream from said field emission element along the flow path for electrons therefrom, and an anode disposed downstream from said grid along said flow path;
   a plurality of first electrically conductive strpps interconnecting successive grids of respective ones of said field emission triodes to form in conjunction with said grids a first microwave transmission line;
   a plurality of second electrically conductive strips interconnecting successive anodes of respective ones of said field emission triodes to form in conjunction with said anodes a second microwave transmission line;
   means for applying an input microwave signal to said first transmission line near the grid of the first of said cascaded field emission triodes;
   means for obtaining an output microwave signal from said second transmission line near the anode of the last of said cascaded field emission triodes; and
   means for applying operating potentials to said field emission elements, said grids, and said anodes.

2. A microwave distributed amplifier according to claim 1 wherein said input microwave signal is applied to one end of said first transmission line, the other end of said first transmission line being terminated in its characteristic impedance; and
   said output microwave signal is obtained from the end of said second transmission line remote from said one end of said first transmission line, the other end of said second transmission line being terminated in its characteristic impedance.

3. A microwave distributed amplifier according to claim 1 wherein said first and second transmission lines each have substantially the same characteristic impedance.

4. A microwave distributed amplifier according to claim 1 wherein said first transmission line includes an input strip extending from the grid of the first cascaded field emission triode in a direction away from the grid of the second cascaded field emission triode, said input microwave signal being applied to said input strip, and a first end strip extending from the grid of the last cascaded field emission triode in a direction away from the grid of the next-to-last cascaded field emission triode, said first end strip having a length terminating said first transmission line in its characteristic impedance; and said second transmission line includes an output strip extending from the anode of the last cascaded field emission triode in a direction away from the anode of the next-to-last cascaded field emission triode, said microwave output signal being obtained from said output strip, and a second end strip extending from the anode of the first cascaded field emission triode in a direction away from the anode of the second cascaded field emission triode, said second end strip having a length terminating said second transmission line in its characteristic impedance.

5. A microwave distributed amplifier according to claim 1 wherein the field emission element of each of said field emission triodes is shaped substantially as a semiellipsoid of revolution having a sharply curved end region providing an electron emissive area and located adjacent to a respective one of said grids.

6. A microwave distributed amplifier according to claim 5 wherein said end region of each said field emission element has a radius of curvature ranging from about 200 Å to about 400 Å.

7. A microwave distributed amplifier according to claim 5 wherein each said field emission element further includes a coating of a low work function carbide on said electron emissive area.

8. A microwave distributed amplifier according to claim 1 wherein each of said grids, anodes and first and second electrically conductive strips are made of superconductive material.

9. A microwave distributed amplifier according to claim 1 wherein each of said grids is an electrically conductive ring disposed about the electron flow path in a respective one of said field emission triodes.

10. A microwave distributed ampliifer according to claim 9 wherein each of said anodes is an electrically conductive ring disposed downstream from and substantially coaxially aligned with a respective one of said grids along said electron flow path.

11. A microwave distributed amplifier according to claim 10 and further including electrically conductive means disposed along the respective flow paths of said field emission triodes downstream from said anodes for collecting electrons traveling along said paths, and means for applying an operating potential to said electrically conductive means.

12. A microwave distributed amplifier according to claim 11 wherein said electrically conductive means is a common relatively thick electrically conductive plate disposed at the ends of said paths.

13. A microwave distributed amplifier according to claim 9 wherein each of said anodes is an electrically conductive slab disposed downstream from a respective one of said grids at the end of said electron flow path.

14. A microwave distributed amplifier according to claim 13 wherein the thickness of each of said slabs is substantially greater than the thickness of each of said second electrically conductive strips.

15. A microwave distributed amplifier according to claim 14 and further including a plurality of dielectric rods of high thermal conductivity contacting respective ones of said slabs and extending therefrom in a direction away from respective ones of said electron flow paths.

16. A microwave distributed amplifier according to claim 1 wherein a plurality of electrically insulating posts are disposed between respective ones of said first and second electrically conductive strips.

17. A microwave distributed amplifier according to claim 16 wherein each of said first and second electrically conductive strips has a portion of reduced width adjacent to a respective one of said posts.

18. A microwave distributed amplifier comprising:
a plurality of spaced field emission elements, each having an electron emissive area, mounted on a substrate;
means for providing a like plurality of electron flow paths from respective ones of said field emission elements and including first and second electrically conductive means for providing respective first and second transmission lines, said first electrically conductive means including a plurality of rings disposed about respective ones of said paths in the vicinity of respective ones of said emissive areas and a plurality of first strips interconnecting neighboring rings, said second electrically conductive means including a plurality of circular elements disposed along respective ones of said paths downstream from said rings and a plurality of second strips interconnecting neighboring circular elements;
means for applying an input microwave signal to said first electrically conductive means;
means for obtaining an output microwave signal from said second electrically conductive means; and
means for applying operating potentials to said field emission elements and to said first and second electrically conductive means.

19. A microwave distributed amplifier according to claim 18 wherein said input microwave signal is applied to one end of said first transmission line, the other end of said first transmission line being terminated in its characteristic impedance; and said output microwave signal is obtained from the end of said second transmission line remote from said one end of said first transmission line, the other end of said second transmission line being terminated in its characteristic impedance.

20. A microwave distributed amplifier according to claim 18 wherein said first and second transmission lines each have substantially the same characteristic impedance.

21. A microwave distributed amplifier according to claim 18 wherein said first electrically conductive means includes an input strip extending from the ring near one end of said first electrically conductive means in a direction away from the neighboring ring, said input microwave signal being applied to said input strip, and a first end strip extending from the ring near the opposite end of said first electrically conductive means in a direction away from the neighboring ring, said first end strip having a length eerminating said first transmission line in its characteristic impedance; and said second electrically conductive means includes an output strip extending from the circular element near the end of said second electrically conductive means remote from said input strip in a direction away from the neighboring circular element, said microwave output signal being obtained from said output strip, and a second end strip extending from the circular element near the opposite end of said second electrically conductive means in a direction away from the neighboring circular element, said second end strip having a length terminating said second transmission line in its characteristic impedance.

22. A microwave distributed amplifier according to claim 18 wherein each of said field emission elements is shaped substantially as a semiellipsoid of revolution having its base mounted on said substrate and having a sharply curved end region providing said electron emissive area and located approximately within a respective one of said rings.

23. A microwave distributed amplifier according to claim 22 wherein said end region of each said field emission element has a radius of curvature ranging from about 200 Å to about 400 Å.

24. A microwave distributed amplifier according to claim 22 wherein each of said field emision elements further includes a coating of a low work function carbide on said electron emissive area.

25. A microwave distributed amplifier according to claim 18 wherein said substrate and said first and second electrically conductive means are made of superconductive material.

26. A microwave distributed amplifier according to claim 18 wherein each of said circular elements is a ring disposed downstream from and substantially coaxially aligned with a respective one of the rings of said first electrically conductive means.

27. A microwave distributed amplifier according to claim 25 and further including third electrically conductive means disposed in the vicinity of the ends of said paths downstream from said second electrically conductive means for collecting electrons traveling along said paths, and means for applying an operating potential to said third electrically conductive means.

28. A microwave distributed amplifier according to claim 27 wherein said third electrically conductive means is a common relatively thick electrically conductive plate disposed at said ends of said paths.

29. A microwave distributed amplifier according to claim 18 wherein each of said circular elements is a cylinder disposed downstream from a respective one of said rings at the end of said electron flow path.

30. A microwave distributed amplifier according to claim 29 wherein the length of each of said cylinder is substantially greater than the thickness of each of said second strips.

31. A microwave distributed amplifier according to claim 30 and further including a dielectric rod of high thermal conductivity contacting the end surface of each of said cylinders remote from a respective one of said electron flow paths and extending coaxially therefrom.

32. A microwave distributed amplifier according to claim 18 wherein said means for providing said electron flow path includes a plurality of first electrically insulating posts disposed between said substrate and respective ones of said first strips and a plurality of second electrically insulating posts disposed between respective ones of said first and second strips.

33. A microwave distributed amplifier according to claim 32 wherein each of said first and second strips has a portion of reduced width adjacent to a respective one of said first or second posts.

34. A microwave distributed amplifier according to claim 32 wherein respective ones of said first and second posts are substantially aligned with one another.

35. A microwave distributed amplifier comprising:
a substrate of electrically conductive material;
a plurality of field emission elements mounted on said substrate at spaced locations therealong, each field emission element having an electron emissive area at an end region remote from said substrate;
a first layer of electrically insulating material disposed on said substrate and defining a plurality of first openings therein about respective ones of said field emission elements;
a first electrically conductive film disposed on said first layer and being configured in a series of rings substantially aligned with respective ones of said first openings and a series of first strips interconnecting successive rings, respective ones of said rings being located in the vicinity of respective ones of said electron emissive areas;
a second layer of electrically insulating material disposed on said first layer and said first film and defining a plurality of second openings therein substantially aligned with respective ones of said first openings;
a second electrically conductive film disposed on said second layer and being configured in a series of circular elements substantially aligned with respective ones of said rings and a series of said second strips interconnecting successive circular elements;
means for applying an input microwave signal to a region of said first film near the first one of said series of rings;
means for obtaining an output microwave signal from a region of said second film near the last one of said series of circular elements; and
means for applying operating potentials to said field emission elements and said first and second films.

36. A microwave distributed amplifier according to claim 35 wherein said first electrically conductive film includes an input strip extending from the first one of said series of rings in a direction away from the second one of said series of rings, said input microwave signal being applied to said input strip, and a first end strip extending from the last one of said series of rings in a direction away from the next-to-the last one of said series of rings; and
said second electrically conductive film includes an output strip extending from the last one of said series of circular elements in a direction away from the next-to-the last one of said series of circular elements, said microwave output signal being obtained from said output strip, and a second end strip extending from the first one of said series of circular elements in a direction away from the second one of said series of circular elements.

37. A microwave distributed amplifier according to claim 35 wherein each of said field emission elements is shaped substantially as a semiellipsoid of revolution having its base mounted on said substrate and having a sharply curved end region providing said electron emissive area and located approximately within a respective one of said rings.

38. A microwave distributed amplifier according to claim 37 wherein said end region of each said field emission element has a radius of curvature ranging from about 200 Å to about 400 Å.

39. A microwave distributed amplifier according to claim 37 wherein each of said field emission elements further includes a coating of a low work function carbide on said electron emissive area.

40. A microwave distributed amplifier according to claim 35 wherein said substrate and said first and second electrically conductive films are made of superconductive material.

41. A microwave distributed amplifier according to claim 35 wherein each of said circular elements is a cylinder substantially coaxially aligned with a respective one of said rings.

42. A microwave distributed amplifier according to claim 41 wherein the length of each of said cylinders is substantially greater than the thickness of each of said second strips.

43. A microwave distributed amplifier according to claim 42 and further including a dielectric rod of high thermal conductivity contacting the end surface of each of said cylinders remote from a respective one of said electron flow paths and extending coaxially therefrom.

44. A microwave distributed amplifier comprising:
a substrate of electrically conductive material;
a plurality of field emission elements mounted on said substrate at spaced locations therealong, each field emission element having an election emissive area at an end region remote from said substrate;
a first layer of electrically insulating material disposed on said substrate and defining a plurality of first openings therein about respective ones of said field emission elements;
a first electrically conductive film disposed on said first layer and being configured in a series of first rings substantially aligned with respective ones of said first openings and a series of first strips interconnecting successive first rings, respective ones of said first rings being located in the vicinity of respective ones of said electron emissive areas;
a second layer of electrically insulating material disposed on said first layer and said first film and defining a plurality of second openings therein substantially aligned with respective ones of said first openings;
a second electrically conductive film disposed on said second layer and being configured in a series of second rings substantially aligned with respective ones of said first rings and a series of second strips interconnecting successive second rings;
a third layer of electrically insulating material disposed on said second layer and said second film and defining a plurality of third openings therein substantially aligned with respective ones of said second openings;
an electrically conductive plate disposed on said third layer and extending over said third openings;
means for applying an input microwave signal to a region of said first film near the first one of said series of first rings;
means for obtaining an output microwave signal from a region of said second film near the last one of said series of second rings; and
means for applying operating potentials to said field emission elements and said first and second films, and said plate.

45. A microwave distributed amplifier according to claim 44 wherein said first electrically conductive film includes an input strip extending from the first one of said series of first rings in a direction away from the second one of said series of first rings, said input microwave signal being applied to said input strip, and a first end strip extending from the last one of said series of first rings in a direction away from the next-to-the last one of said series of first rings; and
said second electrically conductive film includes an output strip extending from the last one of said series of second rings in a direction away from the next-to-the last one of said series of second rings, said microwave output signal being obtained from said output strip, and a second end strip extending from the first one of said series of second rings in a direction away from the second one of said series of second rings.

46. A microwave distributed amplifier according to claim 44 wherein each of said field emission elements is shaped substantially as a semiellipsoid of revolution having its base mounted on said substrate and having a sharply curved end region providing said electron emissive area and located approximately within a respective first ring.

47. A microwave distributed amplifier according to claim 46 wherein said end region of each said field emission element has a radius of curvature ranging from about 200 Å to about 400 Å.

48. A microwave distributed amplifier according to claim 46 wherein each of said field emission elements further includes a coating of a low work function carbide on said electron emissive area.

49. A microwave distributed amplifier according to claim 44 wherein said substrate and said first and second conductive films are made of superconductive material.

* * * * *